(12) United States Patent
Choo et al.

(10) Patent No.: US 7,042,750 B2
(45) Date of Patent: May 9, 2006

(54) READ ONLY MEMORY DEVICES WITH INDEPENDENTLY PRECHARGED VIRTUAL GROUND AND BIT LINES

(75) Inventors: Yong-Jae Choo, Seoul (KR); In-gyu Park, Yongin (KR)

(73) Assignee: Samsung Electronics Co., Ltd., (KR)

(*) Notice: Subject to any disclaimer, the term of this patent is extended or adjusted under 35 U.S.C. 154(b) by 0 days.

(21) Appl. No.: 10/910,669

(22) Filed: Aug. 3, 2004

(65) Prior Publication Data

US 2005/0057990 A1 Mar. 17, 2005

Related U.S. Application Data

(63) Continuation-in-part of application No. 10/406,476, filed on Apr. 3, 2003, now Pat. No. 6,801,446.

(30) Foreign Application Priority Data

Jul. 18, 2002 (KR) .............................. 2002-41975

(51) Int. Cl.
*G11C 17/14* (2006.01)
(52) U.S. Cl. ...................................... 365/104; 365/203
(58) Field of Classification Search .................... None
See application file for complete search history.

(56) References Cited

U.S. PATENT DOCUMENTS

| 4,602,354 | A | | 7/1986 | Craycraft et al. | |
|---|---|---|---|---|---|
| 5,689,470 | A | * | 11/1997 | Inoue | 365/203 |
| 5,757,709 | A | * | 5/1998 | Suminaga et al. | 365/204 |
| 6,310,811 | B1 | | 10/2001 | Kohno | |
| 6,473,327 | B1 | | 10/2002 | Ishizuka | |
| 6,496,405 | B1 | * | 12/2002 | Hibino | 365/104 |
| 6,529,431 | B1 | * | 3/2003 | Kuo et al. | 365/203 |
| 6,861,714 | B1 | * | 3/2005 | Lee et al. | 257/390 |
| 6,920,058 | B1 | * | 7/2005 | Morikawa | 365/94 |

* cited by examiner

Primary Examiner—Son Mai
(74) Attorney, Agent, or Firm—Myers Bigel Sibley & Sajovec

(57) ABSTRACT

Read only memory(ROM) integrated circuit devices include a ROM cell block. A plurality of virtual ground lines and bit lines are coupled to the ROM cell block. A precharge circuit, including a virtual ground line precharge controller, virtual ground line precharging unit, bit line precharge controller and bit line precharging unit, independently controls timing of precharging the virtual ground lines and the bit lines. The precharge circuit may be configured to deactivate precharging of the virtual ground lines before deactivating precharging of the bit lines. Precharging of the virtual ground lines may be deactivated substantially concurrently with activation of discharging of the virtual ground lines.

22 Claims, 6 Drawing Sheets

READ ONLY MEMORY DEVICES WITH INDEPENDENTLY PRECHARGED VIRTUAL GROUND AND BIT LINES

RELATED APPLICATION

This application is a continuation in part of Ser. No. 10/406,476, filed Apr. 3, 2003, now U.S. Pat. No. 6,801,446 entitled "READ ONLY MEMORY DEVICES WITH INDEPENDENTLY PRECHARGED VIRTUAL GROUND AND BIT LINES AND METHODS FOR OPERATING THE SAME," the disclosure of which is incorporated herein by reference as if set forth in its entirety, and claims priority to Korean Patent Application 2002-41975 filed on Jul. 18, 2002, the contents of which are herein incorporated by reference in their entirety.

BACKGROUND OF THE INVENTION

The present invention relates to integrated circuit memory devices, and in particular to read only memory (ROM) devices having virtual ground and bit lines.

A ROM integrated circuit device includes a ROM storage cell block including storage cells. Bit lines from the storage cells are used to output data from the storage cells during a read operation. Such devices may also include virtual ground lines that may be positioned adjacent the bit lines on the integrated circuit device. As integration density of the device increases, the widths and lengths of lines formed in the integrated circuit device generally are reduced. As a result, electrical coupling may result between adjacent ones of the virtual ground and bit lines.

A variety of approaches may be taken to reduce or prevent such an electrical coupling from adversely affecting the device. For example, when the virtual ground lines and the bit lines are in a precharged state, the supply of the precharge voltage to the bit lines may be stopped when the virtual ground lines are being discharged to ground. As a result, the voltage of the bit lines may be affected by the virtual ground lines and drop to a predetermined level lower than the precharge voltage. To compensate for this drop, the supply of the precharge voltage to the bit lines is not stopped until a predetermined period of time after the virtual ground lines are grounded. Thus, the affect of the virtual ground lines on the bit lines may be reduced or eliminated.

However, because the virtual ground lines and the bit lines are conventionally precharged at the same time, as described above, the precharge voltage is still applied for a predetermined period of time after the virtual ground lines are grounded. Thus, a short-circuit current may flow through the virtual ground lines and, as a result, the virtual ground lines may not be at a ground voltage level. This state may continue until the supply of the precharge voltage to the virtual ground lines stops. If the virtual ground lines are not fully grounded, the operational speed of the ROM integrated circuit device may decrease and its power consumption may increase.

Accordingly, some embodiments of the present invention may provide a ROM semiconductor device that allows virtual ground lines to be fully grounded by preventing short-circuit current from flowing through the virtual ground lines when the virtual ground lines are precharged, discharged and grounded.

SUMMARY OF THE INVENTION

According to some embodiments of the present invention, a read only memory (ROM) integrated circuit device is provided including: a ROM cell block for storing data; a plurality of virtual ground lines connected to the ROM cell block; a plurality of virtual ground line precharge controllers, each receiving a virtual ground line precharge control signal and an address control signal and outputing a virtual ground line precharge signal; a plurality of virtual ground line precharging units for precharging the plurality of virtual ground lines in response to the virtual ground line precharge signals; a plurality of bit lines connected to the ROM cell block; a plurality of bit line precharging units that precharge the plurality of bit lines in response to bit line precharge signals; and a plurality of switches connected to the plurality of virtual ground lines and for grounding the virtual ground lines in response to discharge signals.

In other embodiments, when the virtual ground line precharge control signal and the address control signal are at a logic "high" level, the virtual ground line precharge signal is at a logic "low" activated level, and when either the virtual ground line precharge control signal or the address control signal is at a logic "low" level, the virtual ground line precharge signal is at a logic "high" deactivated level.

When the virtual ground line precharge signal is at a logic "low" activated level, the virtual ground line precharging unit may be activated to precharge the virtual ground line, and when the virtual ground line precharge signal is at a logic "high" deactivated level, the virtual ground line precharging unit may be deactivated.

In further embodiments of the present invention, the ROM integrated circuit device further includes a bit line precharge controller that receives a bit line precharge control signal and outputs the bit line precharge signals.

In other embodiments, when the bit line precharage control signal is at a logic "high" level, the bit line precharge signal is at a logic "low" activated level, and when the bit line precharge control signal is at a logic "low" level, the bit line precharge signal is at a logic "high" deactivated level.

When the bit line precharge signal is at a logic "low" activated level, the plurality of bit line precharging units may be activated to precharage the bit lines, and when the bit line precharge signal is at a logic "high" deactivated level, the plurality of bit line precharging units may be deactivated.

In further embodiments of the present invention, the ROM integrated circuit device further includes a plurality of discharge controllers that receive a discharge control signal and an address signal and output the discharge signal.

When either the discharge control signal or the address signal is at a logic "low", the plurality of discharge controllers may output the discharge control signal at a logic "high" activated level, and when the discharge control signal and the address signal are both at a logic "high" level, the plurality of discharge controllers may output the discharge signal at a logic "low" deactivated level.

When the discharge signal is at a logic "high" activated level, the switches may be activated to couple a corresponding virtual ground line to ground, and when the discharge signal is at a logic "low" deactivated level, the switches may be deactivated.

In further embodiments of the present invention, a ROM integrated circuit device is also provided including: a ROM cell block for storing data; a plurality of bit lines connected to the ROM cell block; a plurality of virtual ground lines connected to the ROM cell block; a plurality of virtual ground line precharge controllers, each receiving a virtual ground line precharge control signal and an address control signal and outputting a virtual ground line precharge signal; a plurality of virtual ground line precharging units for precharging the plurality of virtual ground lines in response to the virtual ground line precharge signals and outputting bit line precharge control signals; a plurality of bit line precharge controllers, each receiving bit line precharge control signals from adjacent two virtual ground line precharging units and outputting bit line precharge signals; a plurality of bit line precharging units that precharge the plurality of bit lines in response to the bit line precharge signals; and a plurality of switches connected to the plurality of virtual ground lines and for grounding the virtual ground lines in response to discharge signals.

In some embodiments of the present invention, when the virtual ground line precharge control signal and the address control signal are at a logic "high" level, the virtual ground line precharge signal is at a logic "low" activated level, and when either the virtual ground line precharge control signal or the address control signal is at a logic "low" level, the virtual ground line precharge signal is at a logic "high" deactivated level.

When the virtual ground line precharge signal is at a logic "low" activated level, the virtual ground line precharging unit may be activated to precharge the virtual ground line, and when the virtual ground line precharge signal is at a logic "high" deactivated level, the virtual ground line precharging unit may be deactivated.

In other embodiments, when the virtual ground line precharge signal is at a logic "low" activated level, the bit line precharge control signal is at a logic "high" level, and when the virtual ground line precharge signal is at a logic "high" deactivated level, the bit line precharge control signal is at a logic "low" level.

In further embodiments, when the bit line precharge control signals input to each bit line precharge controller are both at a logic "high" level, the bit line precharge signal output from each bit line precharge controller is at a logic "low" activated level, and when either of the bit line precharge control signals input to each bit line precharge controller is logic "low" level, the bit line precharge signal output from each bit line precharge controller is at a logic "high" deactivated level.

When the bit line precharge signal is at a logic "low" activated level, the plurality of bit line precharging units may be activated to precharage the bit lines, and when the bit line precharge signal is at a logic "high" deactivated level, the plurality of bit line precharging units may be deactivated.

In other embodiments of the present invention, the ROM integrated circuit device further includes a plurality of discharge controllers that receive a discharge control signal and an address signal and output the discharge signal.

In further embodiments, when either the discharge control signal or the address signal is at a logic "low", the plurality of discharge controllers output the discharge control signal at a logic "high" activated level, and when the discharge control signal and the address signal are both at a logic "high" level, the plurality of discharge controllers output the discharge signal at a logic "low" deactivated level.

When the discharge signal is at a logic "high" activated level, the switches may be activated to couple a corresponding virtual ground line to ground, and when the discharge signal is at a logic "low" deactivated level, the switches may be deactivated.

According to some embodiments of the present invention, the operational speed of a ROM semiconductor device may increase and power consumption may decrease.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set froth herein; rather, theses embodiments are provided so that this disclosure will be through and complete, and will fully convey the scope of the invention to those skilled in the art. Like numbers refer to like elements throughout. It will be understood that when an element such as a layer, region or substrate is referred to as being "on" or "directly coupled" to another element, there are no intervening elements present.

Each embodiment described and illustrated herein includes its complementary conductivity type and/or complementary logic embodiment as well. References to source and drain of transistors herein are interchangeable and intended to encompass complementary conductivity type transistors or alternate technology type transistors except where a specific transistor type is referenced.

Some embodiments of the present invention will now be further described with reference to FIG. 1-5.

Figure 1:
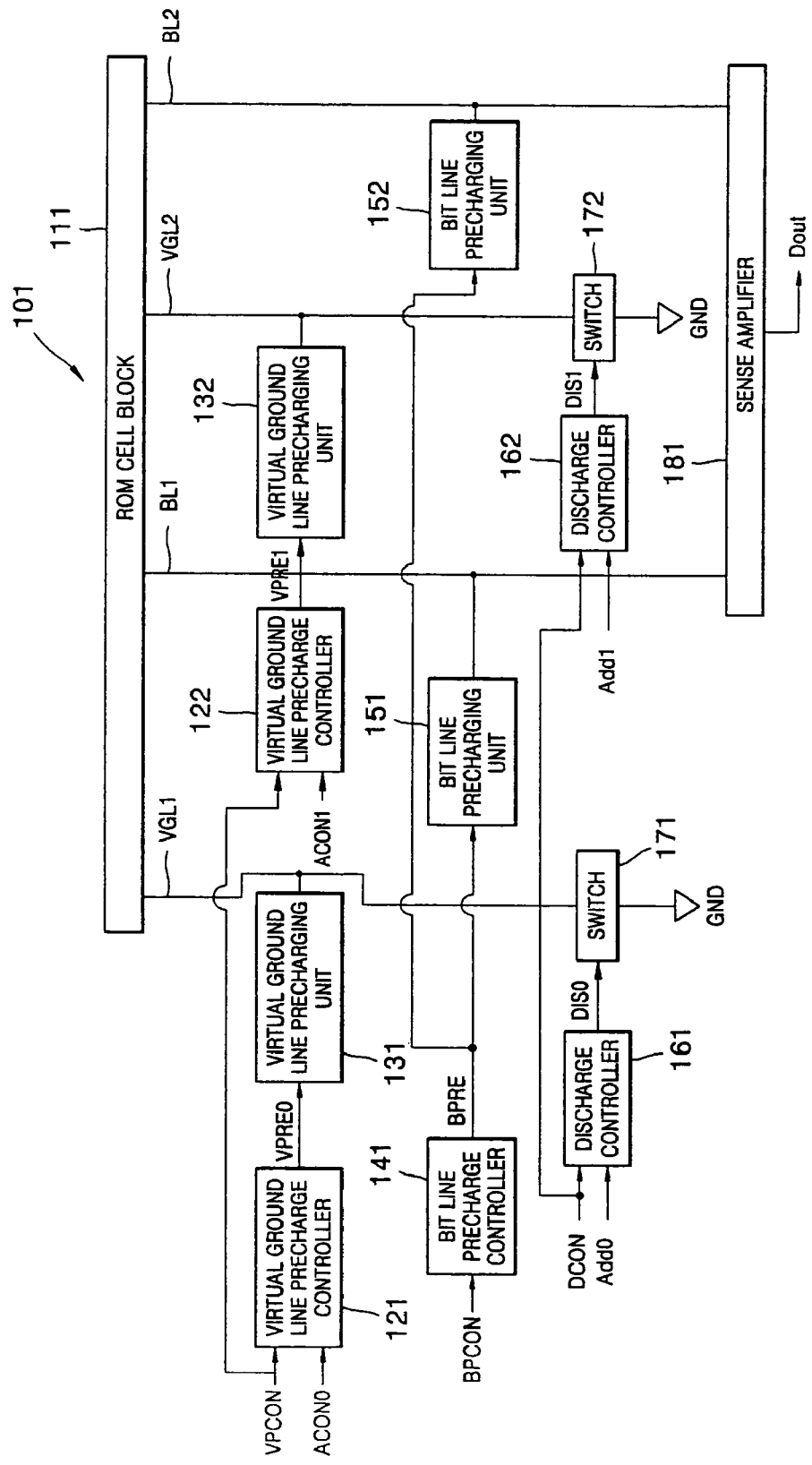
FIG. 1 is a block diagram illustrating a ROM integrated circuit device according to some embodiments of the present invention.

FIG. 1 is a block diagram illustrating a read only memory (ROM) integrated circuit device according to some embodiments of the present invention. As shown in FIG. 1, a ROM integrated circuit device 101 includes a ROM cell block 111, virtual ground lines VGL1, VGL2, etc., bit lines BL1, BL2, etc., a sense amplifier 181, a virtual ground line precharge controller 121, a virtual ground line precharging units 131, 132, etc., bit line precharge controller 141, bit line precharging units 151, 152, etc., discharge controllers 161, 162, etc. and switches 171, 172, etc.

The ROM cell block 111 stores data in one or more storage cells. In the ROM cell block 111, writing of data is not supported due to its read only configuration. The virtual ground lines VGL1, VGL2, etc. and the bit lines BL1, BL2, etc. are connected to the storage cell(s) of the ROM cell block 111.

Data stored in the ROM cell block 11 may be transmitted to the sense amplifier 181 via the bit lines BL1, BL2, etc. As will be understood by those of skill in the art, respective bit lines BL1, BL2, etc. may be associated with individual storage cell(s), such as a column of storage cells, of the ROM cell block 111. The sense amplifier 181 amplifies the transmitted data and transmits the amplified data Dout to an external device.

For the embodiments illustrated in FIGS. 1–5, the virtual ground line precharge controllers 121, 122 receive a virtual ground line precharge control signal VPCON and an address control signal ACON0, ACON1 and output a virtual ground line precharge signal VPRE0, VPRE1. When the virtual ground line precharge control signal VPCON and the address control signal ACON0 or ACON1 are at a logic "high" activated level, the respective virtual ground line precharge controller 121, 122 outputs the virtual ground line precharge signal VPRE0, VPRE1 at a logic "low" activated level. If either of the virtual ground line precharge control signal VPCON and the respective address control signal ACON0, ACON1 is at a logic "low", the corresponding virtual ground line precharge controller 121, 122 outputs the virtual ground line precharge signal VPRE0, ACON1 at a logic "high" deactivated level.

The virtual ground line precharging units 131, 132, etc. precharge the virtual ground lines VGL1, VGL2, etc. in response to activation of the virtual ground line precharge signal VPRE0 output from the virtual ground line precharge controller 121. In other words, if the virtual ground line precharge signal VPRE0 is at a logic "low" level, the virtual ground line precharging units 131, 132, etc. are activated to precharge the virtual ground lines VGL1, VGL2, etc. When the virtual ground line precharge signal VPRE0 is at a logic "high" level, the virtual ground line precharging units 131, 132, etc. are deactivated and thus do not couple the virtual ground lines VGL1, VGL2, etc. to a precharge voltage.

For the embodiments of FIGS. 1–5, the bit line precharge controller 141 receives a bit line precharge control signal BPCON and outputs a bit line precharge signal BPRE. When the bit line precharge control signal BPCON is at a logic "high" level, the bit line precharge controller 141 outputs the bit line precharge signal BPRE at a logic "low" activated level. When the bit line precharge control signal BPCON is at a logic "low" level, the bit line precharge controller 141 outputs the bit line precharge signal BPRE at a logic "high" deactivated level.

The bit line precharging units 151, 152, etc. precharge the bit lines BL1, BL2, etc. in response to the bit line precharge signal BPRE output from the bit line precharge controller 141. In other words, if the bit line precharge signal BPRE is at a logic "low" level, the bit line precharging units 151, 152, etc. are activated to couple the bit lines BL1, BL2, etc. to a precharge voltage. When the bit line precharge signal BPRE is at a logic "high" level, the bit line precharging units 151, 152, etc. are deactivated and, thus, do not couple the bit lines BL1, BL2, etc. to the precharge voltage.

In some embodiments of the present invention, the discharge controllers 161, 162, etc. receive a discharge control signal DCON and address signals ADD0, ADD1, etc. and output discharge signals DIS0, DIS1, etc. In particular, for example, the discharge controller 161 receives the discharge signal DCON and address signal ADD0 and outputs the discharge signal DIS0. If either the discharge control signal DCON or the address signal ADD0 is at a logic "low" level, the discharge controller 161 outputs the discharge signal DIS0 at a logic "high" activated level. If the discharge control signal DCON and the address signal ADD0 are both at a logic "high" level, the discharge controller 161 outputs the discharge signal DIS0 at a logic "low" deactivated level.

Similarly, the discharge controller 162 receives the discharge control signal DCON and the address signal ADD1 and outputs the discharge signal DIS1. If either the discharge control signal DCON or the address signal ADD1 is at a logic "low" level, the discharge controller 162 outputs the discharge signal DIS1 at a logic "high" activated level. When the discharge control signal DCON and the address signal ADD1 are both at a logic "high" level, the discharge controller 162 outputs the discharge signal DIS1 at a logic "low" deactivated level. Thus, as described above, the discharge controller 161,162, etc. may be selectively activated responsive to the address signals ADD0, ADD1, etc.

For the embodiments shown in FIGS. 1–5, the switches 171, 172, etc. selectively couple the virtual ground lines VGL1, VGL2, etc. to ground responsive to the discharge signals DIS0, DIS1, etc. In other words, when the discharge signal DIS0 is at a logic "high" level, the switch 171 is activated to ground the virtual ground line VGL1. When the discharge signal DIS0 is at a logic "low" level, the switch 171 is deactivated, and, thus, the virtual ground line VGL1 is not grounded. Similarly, when the discharge signal DIS1 is at a logic "high" level, the switch 172 is activated to ground the virtual ground line VGL2. When the discharge signal DIS1 is at a logic "low" level, the switch 172 is deactivated, and, thus, the virtual ground line VGL2 is not grounded.

Figure 2:
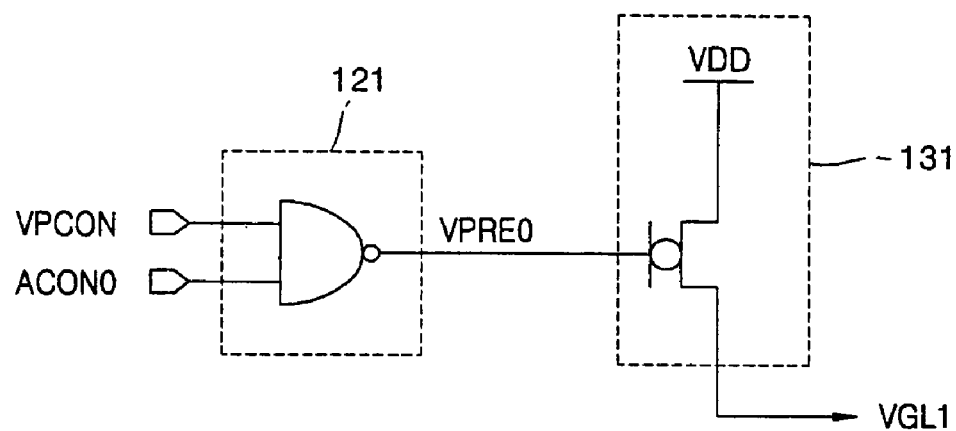
FIG. 2 is a circuit diagram illustrating the first virtual ground line precharge controller and the first virtual ground line precharging unit illustrated in FIG. 1, according to some embodiments of the present invention.

FIG. 2 is a circuit diagram illustrating the virtual ground line precharge controller 121 and the virtual ground line precharging unit 131 shown in FIG. 1 according to some embodiments of the present invention. Referring to the embodiments of FIG. 2, the virtual ground line precharge controller 121 includes a NAND gate which receives the virtual ground line precharge control signal VPCON and the address control signal ACON0 as inputs and outputs the virtual ground line precharge signal VPRE0 (i.e., generates VPRE0 as a Boolean NAND operation of VPCON and ACON0). The virtual ground line precharging unit 131 includes a PMOS transistor that has a source coupled to a power voltage VDD, a gate coupled to the virtual ground line precharge signal VPRE, and a drain coupled to the virtual ground line VGL1.

Figure 3:
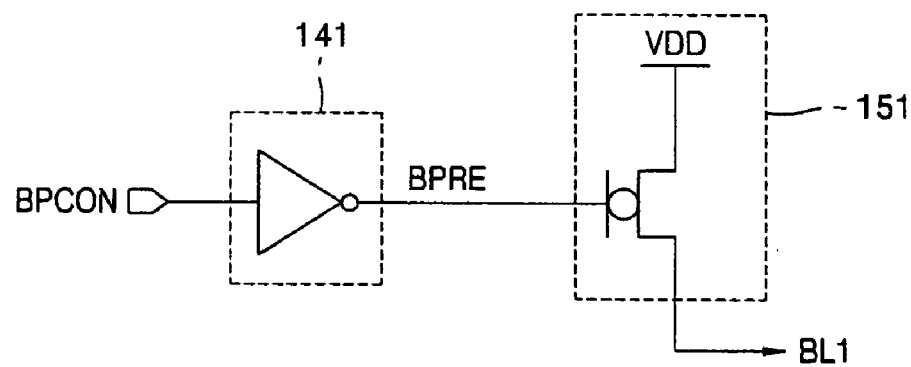
FIG. 3 is a circuit diagram illustrating the bit line precharge controller and a first bit line precharging unit illustrated in FIG. 1, according to some embodiments of the present invention.

FIG. 3 is a circuit diagram illustrating the bit line precharge controller 141 and the bit line precharging unit 151 shown in FIG. 1 according to some embodiments of the present invention. Referring to the embodiments of FIG. 3, the bit line precharge controller 141 includes an inverter that receives the bit line precharge control signal BPCON and outputs the bit line precharge signal BPRE. The bit line precharging unit 151 includes a PMOS transistor that has a source coupled to the power voltage VDD, a gate coupled to the bit line precharge signal BPRE, and a drain coupled to the bit line BL1.

Figure 4:
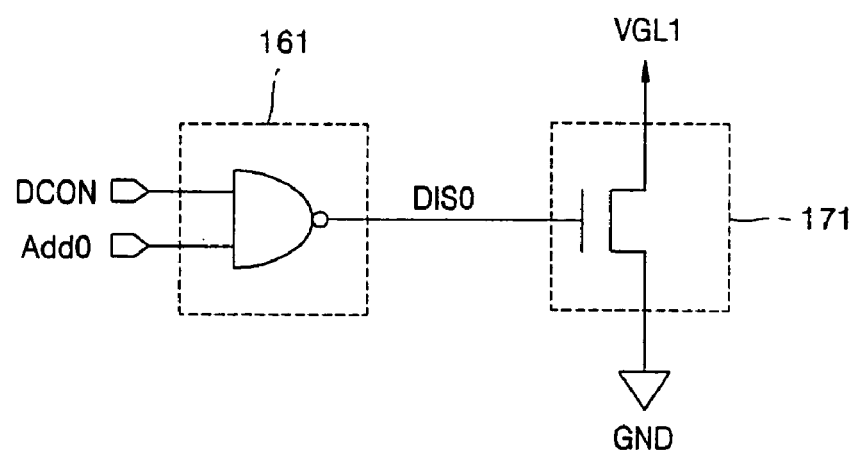
FIG. 4 is a circuit diagram illustrating the first discharge controller and the first switch illustrated in FIG. 1, according to some embodiments of the present invention.

FIG. 4 is a circuit diagram illustrating the discharge controller 161 and the switch 171 shown in FIG. 1 according to some embodiments of the present invention. Referring to the embodiments of FIG. 4, the discharge controller 161 includes a NAND gate that receives the discharge control signal DCON and the address signal ADD0 as inputs and outputs the discharge signal DIS0.

The switch 171 includes a NMOS transistor that has a drain coupled to the virtual ground line VGL1, a gate coupled to the discharge signal DIS0, and a source coupled to ground.

Figure 5:
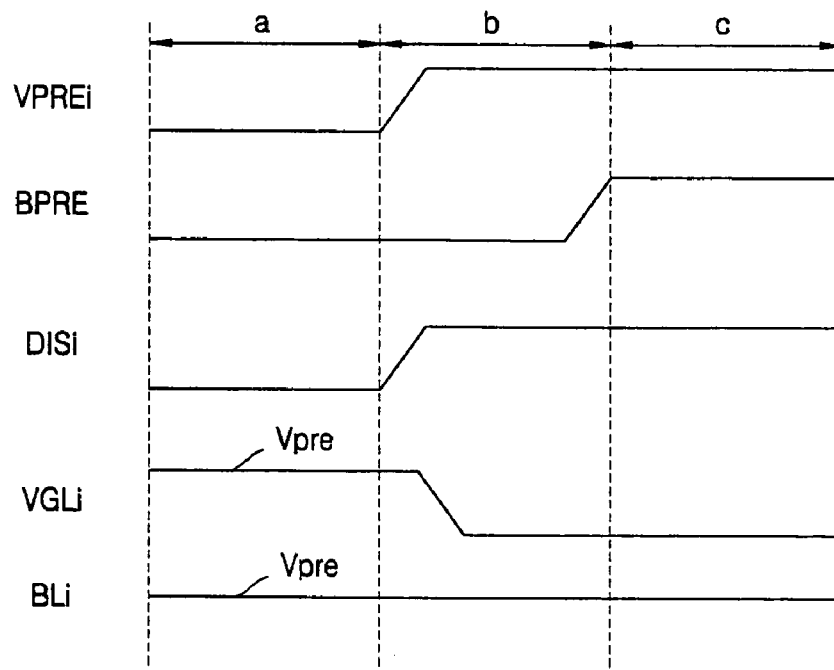
FIG. 5 is a timing diagram illustrating operations of the device illustrated in FIG. 1, according to some embodiments of the present invention.

FIG. 5 is a timing diagram illustrating operations of the device 101 of FIG. 1 according to some embodiments of the present invention. As shown in section (a) of the embodiments of FIG. 5, the virtual ground line precharge signals VPREi(I=0, 1, 2 . . . ), the bit line precharge signal BPRE, and the discharge signal DISi are at a logic "low" level. The virtual ground lines VGLi and the bit lines Bli are precharged to a precharge voltage Vpre. As shown in section (b), the virtual ground line precharge signal VPRE and the discharge signal DISi are transitioned, substantially concurrently, to a logic "high" level, and the virtual ground lines (VGL1, VGL2, etc. shown in FIG. 1) are grounded. Here, the virtual ground lines VGLi are selectively grounded depending on whether their respective address signals (ADD0, ADD1, etc. shown in FIG. 1) are activated. However, as VPRE is deactivated (shown as a logic "high" level), the supply of the precharge voltage Vpre to the virtual ground lines VGLi stops substantially at the same time as when the virtual ground lines VGLi are grounded. Thus, a short-circuit condition, in which current would flow from Vpre to the virtual ground lines VGLi, may be reduced or prevented.

Even though for the embodiments described above, the virtual ground lines VGLi are grounded and decoupled from the precharge voltage Vpre, the supply of the precharge voltage Vpre to the bit lines Bli (BL1, BL2, etc. illustrated in FIG. 1) is maintained. Thus, although the virtual ground lines VGLi may be adjacent to the bit lines BLi, the voltage of the bit lines Bli may not drop when the virtual ground lines VGLi are grounded. In other words, any electronic coupling effect between the virtual ground and bit lines may be reduced.

As shown in section (c) of the embodiments of FIG. 5, the bit line precharge signal BPRE is transitioned to a logic "high" deactivated level so the virtual ground line precharge signal VPRE, the bit line precharge signal BPRE and the discharge signal DISi are still at a logic "high" level. Thus, the virtual ground lines VGLi are still selectively grounded and the supply of the precharge voltage to the bit lines BLi stops. Therefore, in section (c), data stored in the ROM cell block 111 may be read.

As described above, the timing of precharging of the virtual ground lines (VGL1, VGL2, . . . shown in FIG. 1) and the bit lines (BL1, BL2, . . . shown in FIG. 1) may be independently controlled. Thus, when the virtual ground lines (VGL1, VGL2, . . . shown in FIG. 1) are grounded, a short-circuit current may be reduced or prevented from flowing through the virtual ground lines VGLi. As a result, the operational speed of the ROM integrated circuit device 101 (illustrated in FIG. 1) may be increased and power consumption may be decreased. Furthermore, when the virtual ground lines (VGL1, VGL2, . . . shown in FIG. 1) are grounded, the supply of the precharge voltage Vpre to the bit lines (BLI, BL2, . . . shown in FIG. 1) may be continued. Thus, dropping of the precharge voltage Vpre of the bit lines BLi may be reduced or prevented.

Further embodiments of the present invention will now be further described with reference to FIGS. 6–9.

Figure 6:
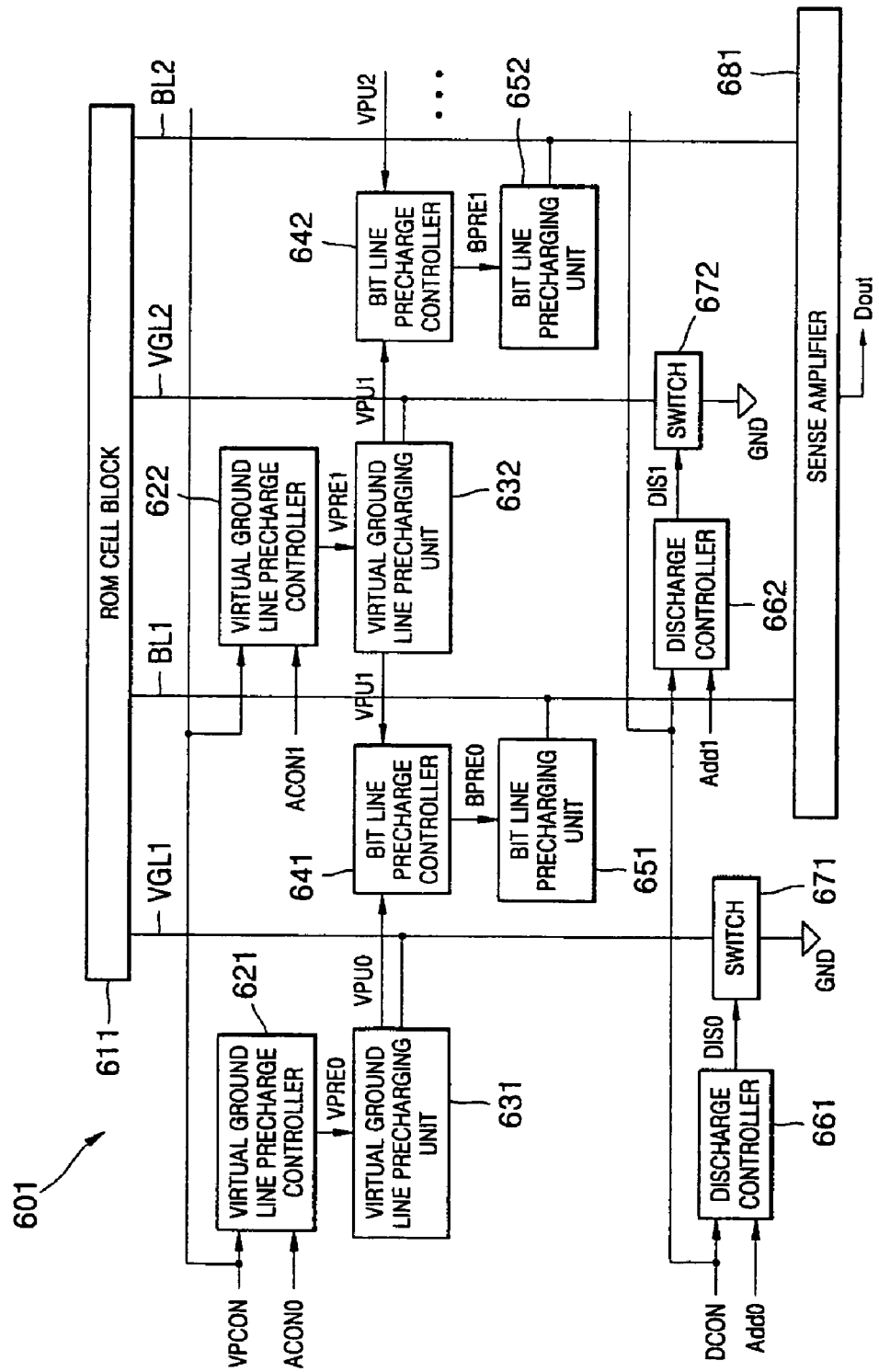
FIG. 6 is a block diagram illustrating a ROM integrated circuit device according to further embodiments of the present invention.

FIG. 6 is a block diagram illustrating a ROM integrated circuit device according to some embodiments of the present invention. As shown in the embodiments of FIG. 6, a ROM integrated circuit device 601 includes a ROM cell block 611, virtual ground lines VGL1, VGL2, etc., bit lines BL1, BL2, etc., virtual ground line precharge controllers 621, 622, etc., virtual ground line precharging units 631, 632, etc., bit line precharge controllers 641, 642, etc., bit line precharging units 651, 652, etc., discharge controllers 661, 662, etc., switches 671, 672, etc. and a sense amplifier 681.

The ROM cell block 611 stores data in one or more storage cells. In the ROM cell block 611, writing of data is not supported due to its read only configuration. The virtual ground lines VGL1, VGL2, etc. and the bit lines BL1, BL2, etc. are connected to the storage cell(s) of the ROM cell block 611.

Data stored in the ROM cell block 611 may be transmitted to the sense amplifier 681 via the bit lines BL1, BL2, etc. As will be understood by those of skill in the art, respective bit lines BL1, BL2, etc. may be associated with individual storage cell(s), such as a column of storage cells, of the ROM cell-block 611. The sense amplifier 681 amplifies the transmitted data and transmits the amplified data Dout to an external device.

The virtual ground line precharge controller 621 in the illustrated embodiments of FIG. 6 receives a virtual ground line precharge control signal VPCON and an address control signal ACON0 as inputs and outputs a virtual ground line precharge signal VPRE0. When the virtual ground line precharge control signal VPCON and the address control signal ACON0 are both at a logic "high" activated level, the virtual ground line precharge controller 621 outputs the virtual ground line precharge signal VPRE0 at a logic "low" activated level. If either the virtual ground line precharge control signal VPCON or the address control signal ACON0 is at a logic "low", the virtual ground line precharge controller 621 outputs the virtual ground line precharge signal VPRE0 at a logic "high" deactivated level.

For the embodiments illustrated in FIG. 6, the virtual ground line precharge controller 622 receives a virtual ground line precharge control signal VPCON and an address control signal ACON1 as inputs and outputs a virtual ground line precharge signal VPRE1. When the virtual ground line precharge control signal VPCON and the address control signal ACON1 are both at a logic "high" activated level, the virtual ground line precharge controller 621 outputs the virtual ground line precharge signal VPRE1 at a logic "low" activated level. If either the virtual ground line precharge control signal VPCON or the address control signal ACON1 is at a logic "low", the virtual ground line precharge controller 621 outputs the virtual ground line precharge signal VPRE1 at a logic "high" deactivated level.

In the illustrated embodiments of FIG. 6, the virtual ground line precharging unit 631 precharges the virtual ground lines VGL1 responsive to activation of the virtual ground line precharge signal VPRE0. In other words, when the virtual ground line precharge signal VPRE0 is at a logic "low" level, the virtual ground line precharging unit 131 is activated to precharge the virtual ground lines VGL1. When the virtual ground line precharge signal VPRE0 is at a logic "high" level, the virtual ground line precharging unit 131 is deactivated and thus does not couple the virtual ground line VGL1 to a precharge voltage. Also, the virtual ground line precharging unit 631 inverts the virtual ground line precharge signal VPRE0 and outputs as bit line precharge control signal VPU0.

For the embodiments illustrated in FIG. 6, the virtual ground line precharging unit 632 precharges the virtual ground lines VGL2 responsive to activation of the virtual ground line precharge signal VPRE1. In other words, when the virtual ground line precharge signal VPRE1 is at a logic "low" level, the virtual ground line precharging unit 631 is activated to precharge the virtual ground lines VGL2. When the virtual ground line precharge signal VPRE1 is at a logic "high" level, the virtual ground line precharging unit 631 is deactivated and thus do not couple the virtual ground line VGL2 to a precharge voltage. Also, the virtual ground line precharging unit 632 inverts the virtual ground line precharge signal VPRE1 and outputs a bit line precharge control signal VPU1.

The bit line precharge controller 641, in the embodiments of FIG. 6, receives bit line precharge control signals VPU0 & VPU1 and outputs a bit line precharge signal BPRE0. When the bit line precharge control signals VPU0 & VPU1 are both at a logic "high" level, the bit line precharge controller 641 outputs the bit line precharge signal BPRE0 at a logic "low" activated level. When either of the bit line precharge control signals VPU0 and VPU1 is at a logic "low" level, the bit line precharge controller 641 outputs the bit line precharge signal BPRE0 at a logic "high" deactivated level.

For the embodiments illustrated in FIG. 6, the bit line precharge controller 642 receives a bit line precharge control signals VPU1 & VPU2 and outputs a bit line precharge signal BPRE1. When the bit line precharge control signals VPU1 & VPU2 are both at a logic "high" level, the bit line precharge controller 642 outputs the bit line precharge signal BPRE1 at a logic "low" activated level. When either of the bit line precharge control signals VPU1 and VPU2 is at a logic "low" level, the bit line precharge controller 642 outputs the bit line precharge signal BPRE1 at a logic "high" deactivated level.

The bit line precharging units 651, 652, etc., in the embodiments illustrated in FIG. 6, precharge the bit lines BL1, BL2, etc. responsive to the bit line precharge signals BPRE0, BPRE1, etc. In other words, when the bit line precharge signals BPREi(I=0, 1, 2, ... ) are at a logic "low" level, the bit line precharging units 651, 652, etc. are activated to couple the bit lines BL1, BL2, etc. to a precharge voltage. When the bit line precharge signals BPREi are at a logic "high" level, the bit line precharging units 651, 652, etc. are deactivated and, thus, do not couple the bit lines BL1, BL2, etc. to the precharge voltage.

For the embodiments illustrated in FIG. 6, the discharge controllers 661, 662, etc. receive a discharge control signal DCON and address signals ADD0, ADD1, etc. and output discharge signals DIS0, DIS1, etc. In particular, for example, the discharge controller 661 receives the discharge signal DCON and address signal ADD0 and outputs the discharge signal DIS0. If either the discharge control signal DCON or the address signal ADD0 is at a logic "low" level, the discharge controller 161 outputs the discharge signal DIS0 at a logic "high" activated level. If the discharge control signal DCON and the address signal ADD0 are both at a logic "high" level, the discharge controller 661 outputs the discharge signal DIS0 at a logic "low" deactivated level.

Similarly, the discharge controller 662, for the embodiments illustrated in FIG. 6, receives the discharge control signal DCON and the address signal ADD1 and outputs the discharge signal DIS1. If either the discharge control signal DCON or the address signal ADD1 is at a logic "low" level, the discharge controller 662 outputs the discharge signal DIS1 at a logic "high" activated level. When the discharge control signal DCON and the address signal ADD1 are both at a logic "high" level, the discharge controller 662 outputs the discharge signal DIS1 at a logic "low" deactivated level. Thus, as described above, the discharge controller 661,662, etc. may be selectively activated responsive to the address signals ADD0, ADD1, etc.

For the embodiments illustrated in FIG. 6, the switches 671, 672, etc. selectively couple the virtual ground lines VGL1, VGL2, etc. to ground responsive to the discharge signals DIS0, DIS1, etc. In other words, when the discharge signal DIS0 is at a logic "high" level, the switch 671 is activated to ground the virtual ground line VGL1. When the discharge signal DIS0 is at a logic "low" level, the switch 671 is deactivated, and, thus, the virtual ground line VGL1 is not grounded. Similarly, when the discharge signal DIS1 is at a logic "high" level, the switch 672 is activated to ground the virtual ground line VGL2. When the discharge signal DIS1 is at a logic "low" level, the switch 672 is deactivated, and, thus, the virtual ground line VGL2 is not grounded.

Figure 7:
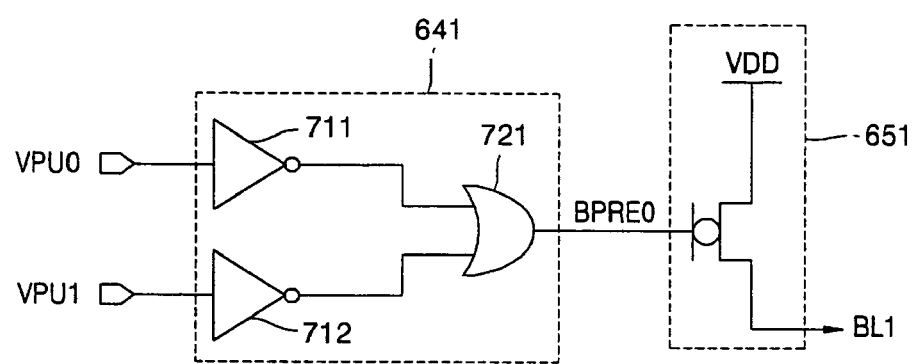
FIG. 7 is a circuit diagram illustrating the first bit line precharge controller and the first bit line precharging unit illustrated in FIG. 6, according to some embodiments of the present invention.

FIG. 7 is a circuit diagram illustrating the bit line precharge controller 641 and the bit line precharging unit 651 illustrated in FIG. 6 according to some embodiments of the present invention. Referring to the embodiments of FIG. 7, the bit line precharge controller 641 includes inverters 711 & 712 that receive the bit line precharge control signals VPU0 & VPU1 and a NAND gate that outputs the bit line precharge signal BPRE0. The bit line precharging unit 651 includes a PMOS transistor that has a source coupled to the power voltage VDD, a gate coupled to the bit line precharge signal BPRE0, and a drain coupled to the bit line BL1.

Figure 8:
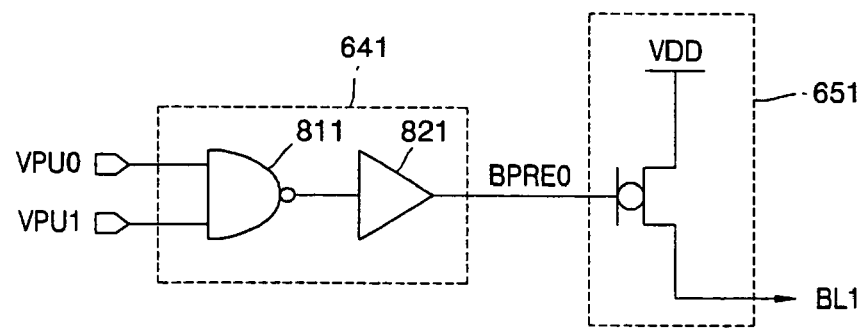
FIG. 8 is a circuit diagram illustrating the first bit line precharge controller and the first bit line precharging unit illustrated in FIG. 6, according to some embodiments of the present invention.

FIG. 8 is a circuit diagram illustrating the bit line precharge controller 641 and the bit line precharging unit 651 illustrated in FIG. 6 according to further embodiments of the present invention. Referring to the embodiments of FIG. 8, the bit line precharge controller 641 includes a NAND gate 811 that receives the bit line precharge control signals VPU0 & VPU1 and a buffer 821 that outputs the bit line precharge signal BPRE0. The bit line precharging unit 651 includes a PMOS transistor that has a source coupled to the power voltage VDD, a gate coupled to the bit line precharge signal BPRE0, and a drain coupled to the bit line BL1.

Figure 9:
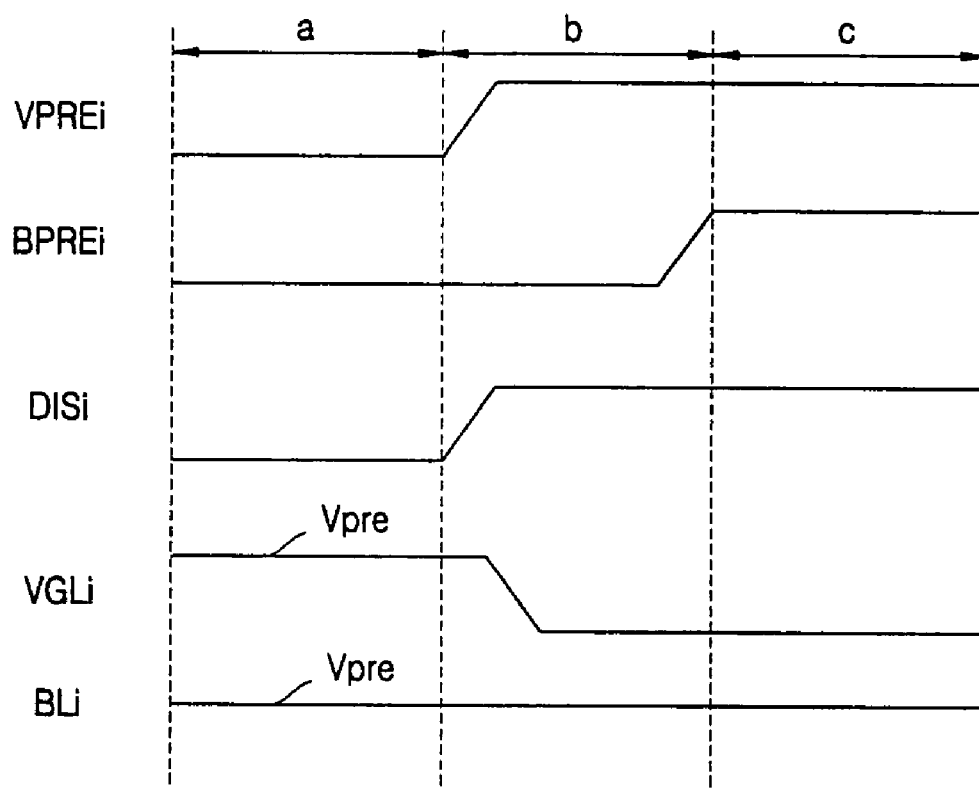
FIG. 9 is a timing diagram illustrating operations of the device illustrated in FIG. 6, according to some embodiments of the present invention.

FIG. 9 is a timing diagram illustrating operations of the device illustrated in FIG. 6 according to some embodiments of the present invention.

As shown in section (a) of FIG. 9, the virtual ground line precharge signals VPREi(I=0, 1, 2, ... ), the bit line precharge signals BPREi(I=0, 1, 2, ... ), and the discharge signal DISi(I=0, 1, 2, ... ) are at a logic "low" level. The virtual ground lines VGLi(I=0, 1, 2, ... ) and the bit lines Bli(I=0, 1, 2, ... ) are precharged to a precharge voltage Vpre. For the illustrated embodiments of FIG. 9, the virtual ground lines VGLi and the bit lines Bli are selectively precharged depending on whether their respective address signals (ACON0, ACON1, etc. shown in FIG. 6) are activated.

As shown In section (b) of FIG. 9, the virtual ground line precharge signals VPREi and the discharge signals DISi are transitioned, substantially concurrently, to a logic "high" level, and the virtual ground lines VGLi are grounded. For the illustrated embodiments of FIG. 9, the virtual ground lines VGLi are selectively grounded depending on whether their respective address signals (ADD0, ADD1, etc. shown in FIG. 1) are activated. However, as VPREi are deactivated (shown as a logic "high" level), the supply of the precharge voltage Vpre to the virtual ground lines VGLi stops substantially at the same time as when the virtual ground lines VGLi are grounded. Thus, a short-circuit condition, in which current would flow from Vpre to the virtual ground lines VGLi, may be reduced or prevented.

As shown in the embodiments of FIG. 9, even though the virtual ground lines VGLi are grounded and decoupled from the precharge voltage Vpre, the supply of the precharge voltage Vpre to the bit lines Bli (BL1,BL2, etc. illustrated in FIG. 1) is maintained. Thus, although the virtual ground lines VGLi may be adjacent to the bit lines BLi, the voltage of the bit lines Bli may not drop when the virtual ground lines VGLi are grounded. In other words, any electronic coupling effect between the virtual ground and bit lines may be reduced.

As shown in section (c) of the embodiments of FIG. 9, the bit line precharge signals BPREi are transitioned to a logic "high" deactivated level, so the virtual ground line precharge signals VPREi, the bit line precharge signals BPREi and the discharge signal DISi are still at a logic "high" level. Thus, the virtual ground lines VGLi are still selectively grounded and the supply of the precharge voltage to the bit lines BLi stops. Therefore, in section (c), data stored in the ROM cell block 111 may be read.

As described above, the timing of precharging of the virtual ground lines VGLi and the bit lines BLi for some embodiments of the present invention are independently controlled. Thus, when the virtual ground lines VGLi are grounded, a short-circuit current may be reduced or prevented from flowing through the virtual ground lines VGLi. As a result, the operational speed of the ROM integrated circuit device 601 (illustrated in FIG. 6) may be increased and power consumption may be decreased. Furthermore, when the virtual ground lines VGLi are grounded, the supply of the precharge voltage Vpre to the bit lines BLi may be continued. Thus, a drop in the precharge voltage Vpre of the bit lines BLi may be reduced or prevented.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A ROM integrated circuit device comprising:
a ROM cell block for storing data;
a plurality of virtual ground lines connected to the ROM cell block;
a plurality of bit lines connected to the ROM cell block;
a plurality of virtual ground line precharging units coupled to the plurality of virtual ground lines connected to the ROM cell block that precharge the plurality of virtual ground lines connected to the ROM cell block in response to virtual ground line precharge signals; and
a plurality of virtual ground line precharge controllers, each receiving a virtual ground line precharge control signal and an address control signal and outputting one of the virtual ground line precharge signals to one of the plurality of virtual ground lines connected to the ROM cell block.

2. The ROM integrated circuit device of claim 1 further comprising:
a plurality of bit line precharging units that precharge the plurality of bit lines in response to a bit line precharge signal; and
a plurality of switches connected to the plurality of virtual ground lines that ground the virtual ground lines in response to discharge signals.

3. The ROM integrated circuit device of claim 2, wherein, when the virtual ground line precharge control signal and the address control signal are at a logic "high" level, the virtual ground line precharge signal is at a logic "low" activated level and wherein, when either the virtual ground line precharge control signal or the address control signal is at a logic "low" level, the virtual ground line precharge signal is at a logic "high" deactivated level.

4. The ROM integrated circuit device of claim 2, wherein, when the virtual ground line precharge signal is at a logic "low" activated level, the virtual ground line precharging unit is activated to precharge the virtual ground line and wherein, when the virtual ground line precharge signal is at a logic "high" deactivated level, the virtual ground line precharging unit is deactivated.

5. The ROM integrated circuit device of claim 2, further comprising a bit line precharge controller that receives a bit line precharge control signal and outputs the bit line precharge signal.

6. The ROM integrated circuit device of claim 5, wherein, when the bit line precharge control signal is at a logic "high" level, the bit line precharge signal is at a logic "low" activated level and wherein, when the bit line precharge control signal is at a logic "low" level, the bit line precharge signal is at a logic "high" deactivated level.

7. The ROM integrated circuit device of claim 6, wherein, when the bit line precharge signal is at a logic "low" activated level, the plurality of bit line precharging units are activated to precharge the bit lines and wherein, when the bit line precharge signal is at a logic "high" deactivated level, the plurality of bit line precharging units are deactivated.

8. The ROM integrated circuit device of claim 2, further comprising a plurality of discharge controllers that receive a discharge control signal and an address signal and output selected ones of the discharge signals.

9. The ROM integrated circuit device of claim 2, wherein, when either the discharge control signal or the address signal is at a logic "low" level, the plurality of discharge controllers output the discharge control signal at a logic "high" activated level and wherein, when the discharge control signal and the address signal are both at a logic "high" level, the plurality of discharge controllers output the discharge signal at a logic "low" deactivated level.

10. The ROM integrated circuit device of claim 9, wherein, when the discharge signal is at a logic "high" activated level, the switches are activated to couple a corresponding virtual ground line to ground and wherein, when the discharge signal is at a logic "low" deactivated level, the switches are deactivated.

11. The ROM integrated circuit device of claim 1, further comprising:
a plurality of bit line precharging units that precharge the plurality of bit lines in response to bit line precharge signals; and
wherein the virtual ground line precharge controllers and precharging units and the bit line precharging units deactivate precharging of the virtual ground lines before deactivating precharging of the bit lines.

12. A ROM integrated circuit device comprising:
a ROM cell block for storing data;
a plurality of bit lines connected to the ROM cell block;
a plurality of virtual ground lines connected to the ROM cell block;

a virtual ground line precharge controller that receives a virtual ground line precharge control signal and an address control signal and outputs at least one virtual ground line precharge signal;

a plurality of virtual ground line precharging units that precharge the plurality of virtual ground lines in response to the at least one virtual ground line precharge signal and output bit line precharge control signals;

a plurality of bit line precharge controllers configured to receive a bit line precharge control signal from at least one of the virtual ground line precharging units and to output bit line precharge signals in response thereto; and a plurality of bit line precharging units that precharge the plurality of bit lines in response to the bit line precharge signals.

13. The ROM integrated circuit device of claim 12, further comprising a plurality of switches connected to the plurality of virtual ground lines that ground the virtual ground lines in response to discharge signals and wherein:

the virtual ground line precharge controller comprises a plurality of virtual ground line precharge controllers, each receiving a virtual ground line precharge control signal and an address control signal and outputting a virtual ground line precharge signal; and each of the plurality of bit line precharge controllers receive bit line precharge control signals from two adjacent virtual ground line precharging units and output the bit line precharge signals responsive thereto.

14. The ROM integrated circuit device of claim 13, wherein, when the virtual ground line precharge control signal and the address control signal are at a logic "high" level, the virtual ground line precharge signal is at a logic "low" activated level and wherein, when either the virtual ground line precharge control signal or the address control signal is at a logic "low" level, the virtual ground line precharge signal is at a logic "high" deactivated level.

15. The ROM integrated circuit device of claim 13, wherein, when the virtual ground line precharge signal is at a logic "low" activated level, the virtual ground line precharging unit is activated to precharge the virtual ground line and wherein, when the virtual ground line precharge signal is at a logic "high" deactivated level, the virtual ground line precharging unit is deactivated.

16. The ROM integrated circuit device of claim 13, wherein, when the virtual ground line precharge signal is at a logic "low" activated level, the bit line precharge control signal is at a logic "high" level and wherein, when the virtual ground line precharge signal is at a logic "high" deactivated level, the bit line precharge control signal is at a logic "low" level.

17. The ROM integrated circuit device of claim 13, wherein, when the bit line precharge control signals input to each bit line precharge controller are both at a logic "high" level, the bit line precharge signal output from each bit line precharge controller is at a logic "low" activated level and wherein, when either of the bit line precharge control signals input to each bit line precharge controller is at a logic "low" level, the bit line precharge signal output from each bit line precharge controller is at a logic "high" deactivated level.

18. The ROM integrated circuit device of claim 17, wherein, when the bit line precharge signal is at a logic "low" activated level, the plurality of bit line precharging units are activated to precharge the bit lines and wherein, when the bit line precharge signal is at a logic "high" deactivated level, the plurality of bit line precharging units are deactivated.

19. The ROM integrated circuit device of claim 13, further comprising a plurality of discharge controllers that receive a discharge control signal and an address signal and output the discharge signal.

20. The ROM integrated circuit device of claim 19, wherein, when either the discharge control signal or the address signal is at a logic "low" level, the plurality of discharge controllers output the discharge control signal at a logic "high" activated level and wherein, when the discharge control signal and the address signal are both at a logic "high" level, the plurality of discharge controllers output the discharge signal at a logic "low" deactivated level.

21. The ROM integrated circuit device of claim 13, wherein, when the discharge signal is at a logic "high" activated level, the switches are activated to couple a corresponding virtual ground line to ground and wherein, when the discharge signal is at a logic "low" deactivated level, the switches are deactivated.

22. The ROM integrated circuit device of claim 12, wherein the virtual ground line precharge controller and precharging units and the bit line precharge controllers and precharging units deactivate precharging of the virtual ground lines before deactivating precharging of the bit lines.

* * * * *